(12) United States Patent
Yang et al.

(10) Patent No.: US 9,570,359 B2
(45) Date of Patent: Feb. 14, 2017

(54) SUBSTRATE STRUCTURE, COMPLEMENTARY METAL OXIDE SEMICONDUCTOR DEVICE, AND METHOD OF MANUFACTURING COMPLEMENTARY METAL OXIDE SEMICONDUCTOR DEVICE

(71) Applicant: Samsung Electronics Co., Ltd., Suwon-si (KR)

(72) Inventors: Moon-seung Yang, Hwaseong-si (KR); Mohammad Rakib Uddin, Hawseong-si (KR); Myoung-jae Lee, Hwaseong-si (KR); Sang-moon Lee, Suwon-si (KR); Sung-hun Lee, Yongin-si (KR); Seong-ho Cho, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/510,354

(22) Filed: Oct. 9, 2014

(65) Prior Publication Data
US 2015/0115321 A1    Apr. 30, 2015

(30) Foreign Application Priority Data

Oct. 31, 2013  (KR) .......................... 10-2013-0131507

(51) Int. Cl.
*H01L 21/20* (2006.01)
*H01L 21/8238* (2006.01)
(Continued)

(52) U.S. Cl.
CPC ... *H01L 21/823807* (2013.01); *H01L 21/0245* (2013.01); *H01L 21/02381* (2013.01);
(Continued)

(58) Field of Classification Search
CPC ................... H01L 21/02645; H01L 21/823807
See application file for complete search history.

(56) References Cited

U.S. PATENT DOCUMENTS 5,273,930 A    12/1993  Steele et al.
6,429,061 B1    8/2002  Rim
(Continued)

FOREIGN PATENT DOCUMENTS

JP    2011003709    1/2011
JP    2012146981    8/2012
(Continued)

OTHER PUBLICATIONS

Tada et al., "Low Temperature Germanium Growth on Silicon Oxide Using Boron Seed Layer and In Situ Dopant Activation," Journal of the Electrochemical Society, 157 (3) H371-H376 (2010).
(Continued)

*Primary Examiner* — Eduardo A Rodela
*Assistant Examiner* — Christopher M Roland
(74) *Attorney, Agent, or Firm* — Onello & Mello, LLP

(57) ABSTRACT

A substrate structure, a complementary metal oxide semiconductor (CMOS) device including the substrate structure, and a method of manufacturing the CMOS device are disclosed, where the substrate structure includes: a substrate, at least one seed layer on the substrate formed of a material including boron (B) and/or phosphorus (P), and a buffer layer on the seed layer. This substrate structure makes it possible to reduce the thickness of the buffer layer and also improve the performance characteristics of a semiconductor device formed with the substrate structure.

14 Claims, 11 Drawing Sheets

(51) Int. Cl.
*H01L 27/092* (2006.01)
*H01L 21/02* (2006.01)

(52) U.S. Cl.
CPC .. *H01L 21/02439* (2013.01); *H01L 21/02452* (2013.01); *H01L 21/02505* (2013.01); *H01L 21/02532* (2013.01); *H01L 21/02538* (2013.01); *H01L 21/02645* (2013.01); *H01L 27/092* (2013.01)

(56) References Cited

U.S. PATENT DOCUMENTS

| | | |
|---|---|---|
| 6,677,192 B1 | 1/2004 | Fitzgerald |
| 6,876,010 B1 | 4/2005 | Fitzgerald |
| 6,963,078 B2 | 11/2005 | Chu |
| 7,071,014 B2 | 7/2006 | Currie et al. |
| 7,172,935 B2 | 2/2007 | Lochtefeld et al. |
| 7,238,595 B2 | 7/2007 | Brabant et al. |
| 7,589,003 B2 | 9/2009 | Kouvetakis et al. |
| 7,723,749 B2 | 5/2010 | Shaheen |
| 7,728,387 B1 | 6/2010 | Krishnamohan et al. |
| 7,799,592 B2 | 9/2010 | Lochtefeld |
| 7,902,009 B2 | 3/2011 | Simonelli et al. |
| 8,173,551 B2 | 5/2012 | Bai et al. |
| 2005/0176229 A1* | 8/2005 | Yao et al. ............ 438/602 |
| 2005/0277260 A1* | 12/2005 | Cohen ............ H01L 21/84 438/387 |
| 2006/0079056 A1 | 4/2006 | Kim et al. |
| 2006/0267017 A1* | 11/2006 | Noguchi ......... H01L 29/66742 257/66 |
| 2009/0095981 A1* | 4/2009 | Kang ............... H01L 21/82380 257/190 |
| 2009/0130826 A1 | 5/2009 | Kim et al. |
| 2009/0166685 A1* | 7/2009 | Hokazono ........ H01L 21/26513 257/288 |
| 2010/0148217 A1* | 6/2010 | Simonelli et al. .......... 257/192 |
| 2012/0032265 A1 | 2/2012 | Simonelli et al. |
| 2012/0175741 A1 | 7/2012 | Vincent et al. |
| 2012/0305992 A1* | 12/2012 | Marino ............ H01L 21/02381 257/200 |
| 2013/0062696 A1* | 3/2013 | Di et al. .................. 257/351 |
| 2013/0069172 A1 | 3/2013 | Liao et al. |
| 2013/0102116 A1 | 4/2013 | Xiao et al. |
| 2013/0105861 A1 | 5/2013 | Liao et al. |
| 2013/0154056 A1 | 6/2013 | Tonari |
| 2014/0191252 A1 | 7/2014 | Lee et al. |
| 2015/0021681 A1* | 1/2015 | Hou ................. H01L 21/82380 257/330 |
| 2015/0069517 A1* | 3/2015 | Yang et al. .................. 257/369 |

FOREIGN PATENT DOCUMENTS

| | | |
|---|---|---|
| JP | 2013125955 | 6/2013 |
| KR | 2006032092 | 4/2006 |
| KR | 2011050713 | 5/2011 |
| WO | 2010068530 | 6/2010 |

OTHER PUBLICATIONS

Olubuyide et al., "Impact of seed layer on material quality of epitaxial germanium on silicon deposited by low pressure chemical vapor deposition," Thin Solid Films 508 (2006) 14-19.

\* cited by examiner

US 9,570,359 B2

SUBSTRATE STRUCTURE, COMPLEMENTARY METAL OXIDE SEMICONDUCTOR DEVICE, AND METHOD OF MANUFACTURING COMPLEMENTARY METAL OXIDE SEMICONDUCTOR DEVICE

CROSS-REFERENCE TO RELATED APPLICATIONS

This application claims the benefit of Korean Patent Application No. 10-2013-0131507, filed on Oct. 31, 2013, in the Korean Intellectual Property Office, the disclosure of which is incorporated herein in its entirety by reference.

BACKGROUND

The inventive concept relates to a substrate structure, a complementary metal oxide semiconductor (CMOS) device including the substrate structure, and a method of manufacturing the CMOS device.

Research has been actively conducted to develop compound semiconductors such as devices using Periodic Table group III-V semiconductor materials. Since the electron mobility of group III-V compound semiconductor materials is equal to or greater than about 10 times to 1,000 times the electron mobility of silicon (Si), group III-V compound semiconductor materials are used in CMOS devices to form high-speed channels or high-efficiency solar cells.

Group III-V substrates such as InP, GaAs, GaSb, or InSb substrates are widely used to grow group III-V semiconductor materials thereon. However, such substrates are expensive as compared with Si substrates and are easily broken during processing, and it is difficult to manufacture such substrates having a large area. For example, the maximum commercially available size of such substrates is about 6 inches. For this reason, semiconductor devices using Si substrates instead of group III-V substrates are being developed.

In addition, there is recently increasing interest in technology for realizing silicon-based photonics integrated circuits; and, along with this, there is increasing demand for technology for forming devices, such as light sources (e.g., light emitting diodes (LEDs) and laser diodes (LD)) and transistors for high-speed devices, on Si substrates by using group III-V compound semiconductor materials. If group III-V compound semiconductors are integrated on large-area Si substrates, processes of the related art for producing silicon may be used, and costs may be reduced.

However, due to the lattice constant difference and thermal expansion coefficient difference between group III-V compound semiconductor materials and Si substrates, various defects are present, and thus there is a limit to the applications for such devices. For example, if a semiconductor thin film having a lattice constant smaller than that of a substrate is grown, dislocation may be caused by compressive stress; and, if a semiconductor thin film having a lattice constant greater than that of a substrate is grown, cracking may be caused by tensile stress.

In addition, technology for growing germanium (Ge) on a Si substrate has been developed to form p-type metal oxide semiconductor (MOS) devices. Since germanium (Ge) has a high degree of hole mobility and a small energy band gap, the use of germanium (Ge) may reduce power consumption. A high-quality germanium (Ge) crystal growing method applicable to mass production, however, may be needed for practical use of germanium (Ge) in such applications.

SUMMARY

According to an aspect of the inventive concept, there is provided a substrate structure capable of reducing the thickness of a buffer layer.

According to another aspect of the inventive concept, there is provided a complementary metal oxide semiconductor (CMOS) device, the CMOS device including an n-type transistor layer and a p-type transistor layer that are disposed on a single substrate.

According to another aspect of the inventive concept, there is provided a method of manufacturing a CMOS device that includes an n-type transistor layer and a p-type transistor layer on a single substrate.

An embodiment of the inventive concept provides a substrate structure including: a substrate; at least one seed layer provided on the substrate and formed of a material including boron (B) or phosphorus (P); and at least one buffer layer on the seed layer.

The seed layer may include at least one layer including boron (B), BGe, BSiGe, P, PGe, PSiGe, B:Ge, B:SiGe, P:Ge, or P:SiGe. The notation "X:Y" is used in this application to refer to a doped material primarily comprising the substance "Y" doped with a relatively minor amount of the substance "X". Thus, for example, the notation B:Ge refers to germanium doped with boron, a material that may have somewhat different chemical properties and/or structure than the substance BGe.

The buffer layer may include at least one layer including germanium (Ge), SiGe, or GeSn.

The substrate may be a silicon-based substrate.

The substrate may be a silicon substrate.

The substrate structure may further include a semiconductor layer on the at least one buffer layer, the semiconductor being formed of a group IV material or a group III-V material.

The group IV material may include germanium (Ge).

The group III-V material may include at least one of InGaAs, InP, InSb, InGaSb, GaSb, and InAs.

The seed layer may have a thickness within a range of greater than 0 nm to about 100 nm.

The buffer layer may have a thickness within a range of greater than 0 μm to about 3 μm.

An embodiment of the inventive concept provides a CMOS device including: a substrate; at least one seed layer provided on the substrate and formed of a material including boron (B) and/or phosphorus (P); at least one buffer layer on the seed layer; a first layer for a first type transistor, the first layer being disposed on the buffer layer; a second layer for a second type transistor, the second layer being spaced apart from the first layer and disposed on the seed layer, on the buffer layer, or on the substrate; and an insulation layer between the first layer and the second layer.

An embodiment of the inventive concept provides a method of manufacturing a CMOS device, the method including: forming a seed layer including boron (B) and/or phosphorus (P) on a substrate; forming a buffer layer on the seed layer; forming a first type transistor material layer on the buffer layer; forming a first pattern and a first layer for a first type transistor by etching the first type transistor material layer; forming an insulation layer on the first layer and the first pattern; forming a second pattern for selective growth by etching the insulation layer; and selectively growing a second layer for a second type transistor on the second pattern.

In an aspect, the substrate structure comprises: a substrate; at least one seed layer provided on the substrate and formed of a material comprising boron (B) and/or phosphorus (P); and at least one buffer layer on the seed layer.

In some embodiments, the substrate structure includes a seed layer that comprises at least one layer comprising boron (B), BGe, BSiGe, P, PGe, PSiGe, B:Ge, B:SiGe, P:Ge, or P:SiGe.

In some embodiments, the substrate structure includes a buffer layer that comprises at least one layer comprising germanium (Ge), SiGe, or GeSn.

In some embodiment, the substrate structure includes a substrate that is a silicon substrate.

In some embodiments, the substrate structure further comprises a semiconductor layer on the at least one buffer layer, the semiconductor being formed of a group IV material or a group III-V material.

In some embodiments, the substrate structure includes a semiconductor that is formed of a group IV material that comprises germanium (Ge).

In some embodiments, the substrate structure includes a semiconductor that is formed of a group III-V material that comprises at least one of InGaAs, InP, InSb, InGaSb, GaSb, and InAs.

In some embodiments, the substrate structure includes a seed layer that has a thickness within a range of greater than 0 nm to about 100 nm.

In some embodiments, the substrate structure includes a buffer layer that has a thickness within a range of greater than 0 μm to about 3 μm.

In an aspect, a complementary metal oxide semiconductor (CMOS) device comprises: a substrate; at least one seed layer provided on the substrate and formed of a material comprising boron (B) and/or phosphorus (P); at least one buffer layer on the seed layer; a first layer for a first type transistor, the first layer being disposed on the buffer layer; a second layer for a second type transistor, the second layer being spaced apart from the first layer and disposed on the seed layer, the buffer layer, or the substrate; and an insulation layer between the first layer and the second layer.

In an embodiment, the CMOS device includes a seed layer that comprises at least one layer comprising boron (B), BGe, BSiGe, P, PGe, PSiGe, B:Ge, B:SiGe, P:Ge, or P:SiGe.

In an embodiment, the CMOS device includes a buffer layer that comprises at least one layer comprising germanium (Ge), SiGe, or GeSn.

In an embodiment, the CMOS device includes a substrate that is a silicon substrate.

In an embodiment, the CMOS device includes a seed layer that has a thickness within a range of greater than 0 nm to about 100 nm.

In an embodiment, the CMOS device includes a buffer layer that has a thickness within a range of greater than 0 μm to about 3 μm.

In an embodiment, the CMOS device includes a first layer that comprises at least one of InGaAs, InP, InSb, InGaSb, GaSb, and InAs.

In an embodiment, the CMOS device includes a second layer that comprises germanium (Ge).

In an embodiment, the CMOS device includes a first type transistor that comprises an n-type metal oxide semiconductor field effect transistor (MOSFET), and the second type transistor comprises a p-type MOSFET.

In an aspect, a method of manufacturing a CMOS device comprises: forming a seed layer comprising boron (B) and/or phosphorus (P) on a substrate; forming a buffer layer on the seed layer; forming a first type transistor material layer on the buffer layer; forming a first pattern and a first layer for a first type transistor by etching the first type transistor material layer; forming an insulation layer on the first layer and the first pattern; forming a second pattern for selective growth by etching the insulation layer; and selectively growing a second layer for a second type transistor on the second pattern.

In an embodiment, the method includes a seed layer that comprises at least one layer comprising boron (B), BGe, BSiGe, P, PGe, PSiGe, B:Ge, B:SiGe, P:Ge, or P:SiGe.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
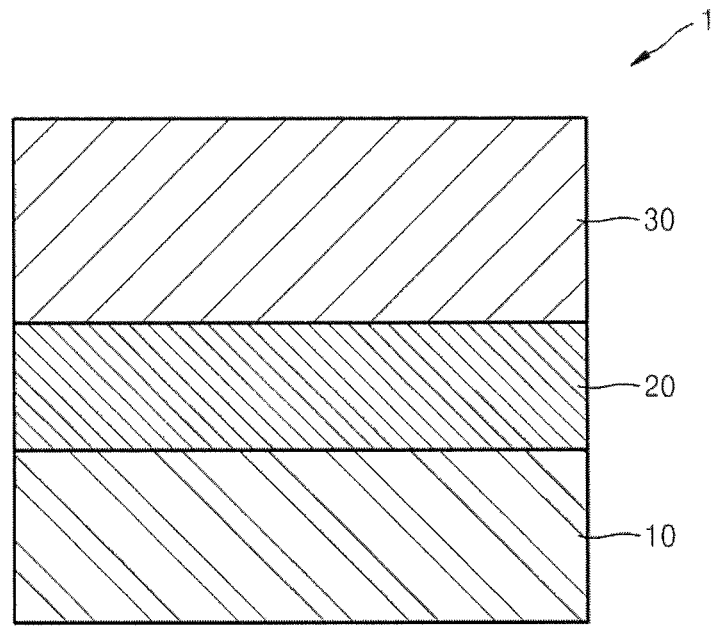
FIG. 1 is a schematic view illustrating a substrate structure according to an exemplary embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

Hereinafter, a complementary metal oxide semiconductor (CMOS) device and a method of manufacturing the CMOS device will be described in detail with reference to the accompanying drawings according to exemplary embodiments of the inventive concept. In the drawings, like reference numbers refer to like elements, and the size of each element may be exaggerated for clarity of illustration. The embodiments described herein are for illustrative purposes only, and various modifications may be made therein. In the following description, when an element is referred to as being "above" or "on" another element, it may be directly on the other element while making contact with the other element or may be above the other element without making contact with the other element.

FIG. 1 is a view illustrating a substrate structure 1 according to an exemplary embodiment of the inventive concept. The substrate structure 1 may include a substrate 10, a seed layer 20 on the substrate 10, and a buffer layer 30 on the seed layer 20. The substrate 10 may be a silicon (Si)-based substrate. For example, the substrate 10 may be a Si substrate. Also for example, the substrate 10 may be doped with a p-type dopant or an n-type dopant.

The seed layer 20 may include at least one layer including boron (B) and/or phosphorus (P). For example, the seed layer 20 may include at least one layer including boron (B), BGe, BSiGe, P, PGe, PSiGe, B:Ge, B:SiGe, P:Ge, or P:SiGe. The notation B:Ge refers to germanium (Ge) doped with boron (B), as previously discussed.

The buffer layer 30 may be formed of a material containing germanium (Ge). For example, the buffer layer 30 may include at least one layer including germanium (Ge), SiGe, or GeSn. The buffer layer 30 may be grown at a relatively low temperature, for example, 450° C. or lower.

The buffer layer 30 may be provided to reduce dislocation caused by a lattice constant difference between the substrate 10 and a layer to be subsequently grown. The buffer layer 30 can also help to suppress cracking caused by a thermal expansion coefficient difference between the substrate 10 and a layer to be grown. The buffer layer 30 may be grown to a predetermined thickness to improve the crystallinity and quality of a layer to be grown. However, it may take a lot of time and cost to grow the buffer layer 30. Therefore, time and costs may be saved if the thickness of the buffer layer 30 can be reduced without adversely affecting performance. The seed layer 20 may contribute to reducing the thickness of the buffer layer 30. For example, the seed layer 20 may reduce defects when the buffer layer 30 is being grown.

For example, the seed layer 20 may have a thickness within the range of greater than 0 nm to about 100 nm. In another example, the seed layer 20 may have a thickness within the range of greater than 0 nm to about 50 nm. Owing to the seed layer 20, the thickness of the buffer layer 30 may be reduced while retaining high performance characteristics. If the thickness of the seed layer 20 is greater than about 100 nm, however, defect density or surface roughness may increase and thereby make it difficult to reduce the thickness of the buffer layer 30. For example, in combination with a suitable seed layer 20, the buffer layer 30 may have a thickness within the range of greater than 0 µm to about 3 µm. In another example, the buffer layer 30 may have a thickness within the range of greater than 0 µm to about 2 µm.

Figure 2:
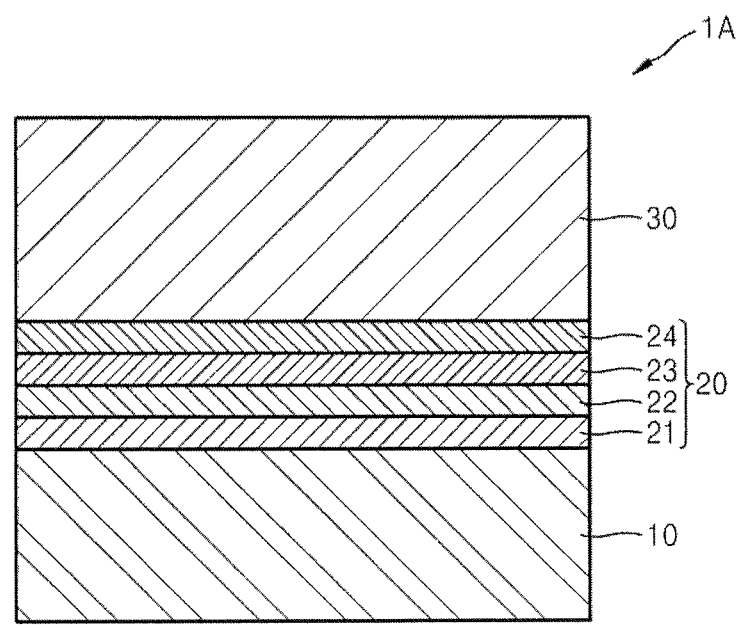
FIG. 2 is a schematic view illustrating an example in which a seed layer of the substrate structure depicted in FIG. 1 includes a plurality of layers.

FIG. 2 illustrates an example in which a seed layer 20 comprises a plurality of layers. Referring to FIG. 2, a substrate structure 1A may include a Si substrate 10, the seed layer 20 including a plurality of layers and disposed on the Si substrate 10, and a buffer layer 30 on the seed layer 20.

For example, the seed layer 20 may comprise a first layer 21, a second layer 22, a third layer 23, and a fourth layer 24. For example, the seed layer 20 may have a structure in which boron (B) layers and BGe layers are alternately arranged. Alternatively, in the seed layer 20, BGe layers and BGeSi layers may be alternately arranged. Alternatively, the seed layer 20 may comprise a graded layer, such as a graded $B_{x1}Ge_{1-x1}$ (where 0<x1<1) layer. The seed layer 20 may also have other various structures that perform in similar ways.

Figure 3:
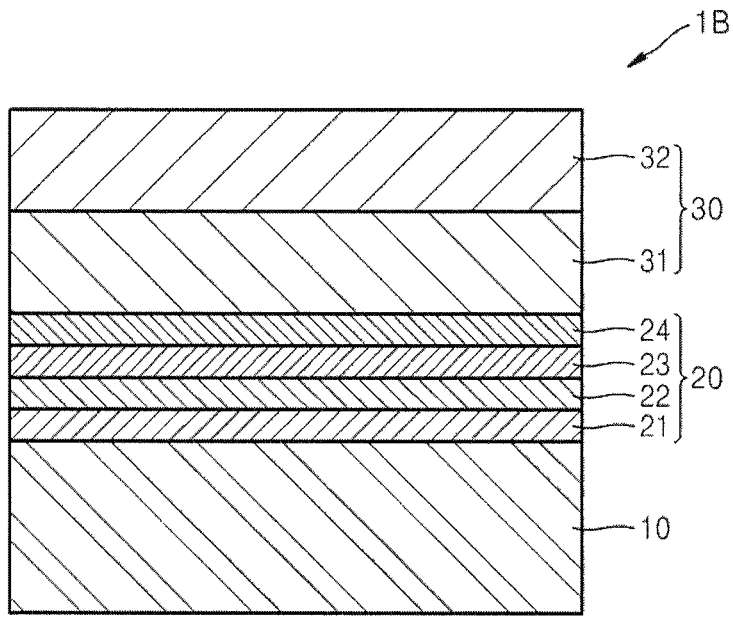
FIG. 3 is a schematic view illustrating an example in which a buffer layer of the substrate structure depicted in FIG. 2 includes a plurality of layers.

FIG. 3 illustrates an example in which a buffer layer 30 comprises a plurality of layers. Referring to FIG. 3, a substrate structure 1B may include a Si substrate 10, a seed layer 20 (such as the four-layer structure shown in FIG. 2) on the Si substrate 10, and the buffer layer 30 including a plurality of layers and disposed on the seed layer 20. The buffer layer 30 may thus comprise a fifth layer 31 and a sixth layer 32. For example, the buffer layer 30 may include a Ge layer 31 and a SiGe layer 32. Alternatively, the buffer layer 30 may comprise a graded layer, such as a graded $Si_{x2}Ge_{1-x2}$ (where 0<x2<1) layer.

In addition, a second seed layer may be provided between the fifth layer 31 and the sixth layer 32 of buffer layer 30 (not shown in FIG. 3).

Figure 4:
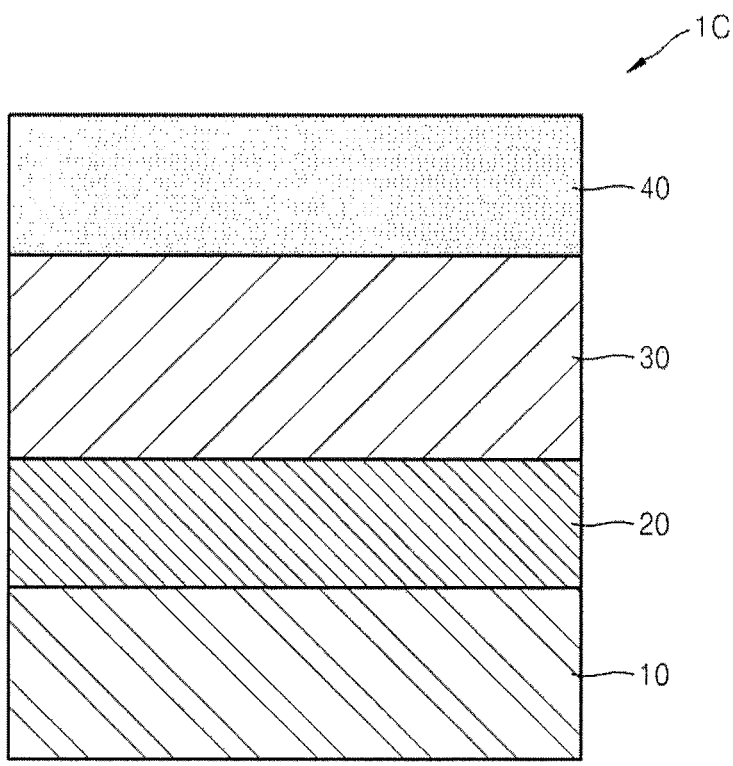
FIG. 4 is a schematic view illustrating an example in which the substrate structure depicted in FIG. 1 further includes a semiconductor layer.

FIG. 4 illustrates an example in which a semiconductor layer 40 is additionally provided on a buffer layer 30. Referring to FIG. 4, a substrate structure 1C may include a substrate 10, a seed layer 20 on the substrate 10, the buffer layer 30 on the seed layer 20, and the semiconductor layer 40 on the buffer layer 30. For example, the semiconductor layer 40 may be formed of a group IV material or a group III-V material. For example, the semiconductor layer 40 may include germanium (Ge). Alternatively, the semiconductor layer 40 may include at least one of InGaAs, InP, InSb, InGaSb, GaSb, and InAs.

The buffer layer 30 may reduce threading dislocation density by relieving the lattice constant difference between the substrate 10 and the semiconductor layer 40. If the buffer layer 30 is relatively thick, the semiconductor layer 40 growing on the buffer layer 30 may have a low degree of threading dislocation density and thus a high level of quality. However, manufacturing costs and time may be increased in proportion to the thickness of the buffer layer 30. According to an embodiment of the inventive concept, owing to the presence of seed layer 20, the crystallinity of the semiconductor layer 40 may be improved even though the thickness of the buffer layer 30 is decreased.

Figure 5:
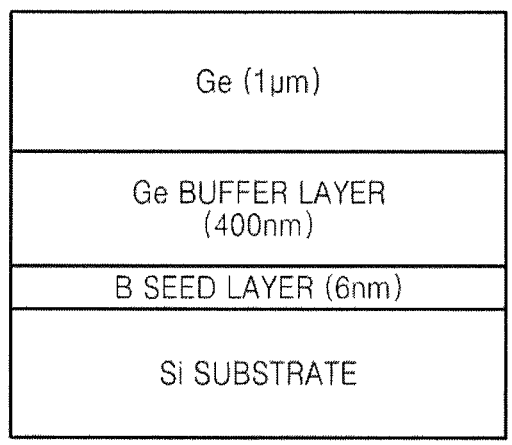
FIGS. 5 and 6 are schematic views illustrating examples of the substrate structure for an exemplary embodiment of the inventive concept.
Figure 6:
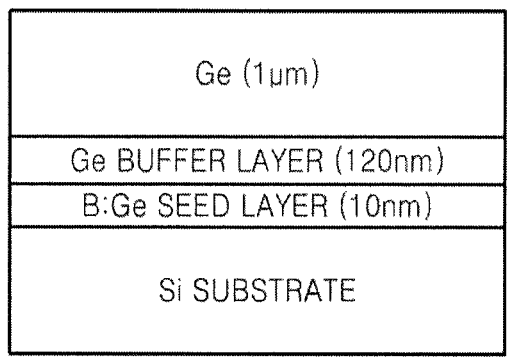
Figure 7:
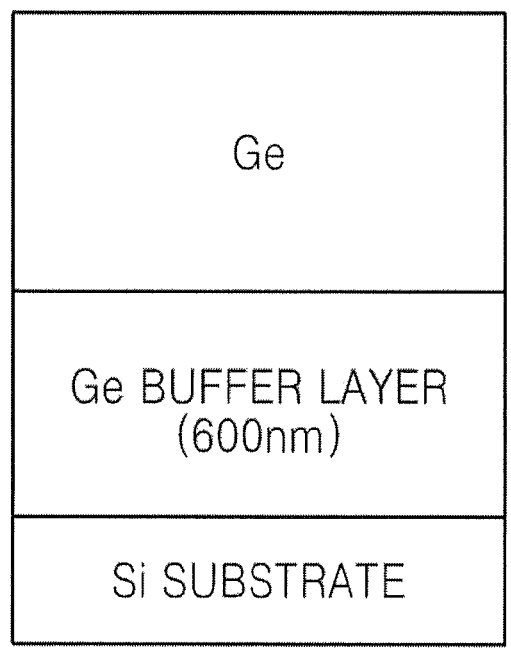
FIG. 7 is a schematic view illustrating a comparative example for comparison with the substrate structures depicted in FIGS. 4 and 5.

FIGS. 5 and 6 illustrate the thicknesses of Ge buffer layers (e.g., buffer layer 30 in FIGS. 1 to 4) according to the growth time periods of seed layers doped with boron (B). In an example illustrated in FIG. 5, a boron seed layer is disposed on a Si substrate to a thickness of about 6 nm, and then a Ge buffer layer is grown. In this case, threading dislocation density is about $1.0\times10^7/cm^2$, and the thickness of the Ge buffer layer is about 400 nm. In an example illustrated in FIG. 6, a Ge seed layer doped with boron (B) is disposed on a Si substrate to a thickness of about 10 nm, and then a Ge buffer layer is grown. In this embodiment, the Ge buffer layer 40 may be differentiated from the Ge seed layer 30 in the respective concentrations of Ge in each layer. In this case, threading dislocation density is about $0.5\times10^7/cm^2$, and the thickness of the Ge buffer layer is about 120 nm. For comparison with the examples illustrated in FIGS. 5 and 6, FIG. 7 illustrates a comparative example in which a Ge buffer layer is grown on a Si substrate without a seed layer therebetween. In this case, threading dislocation density is much greater (about $3.0\times10^7/cm^2$) than for the examples of FIGS. 5 and 6 even though the thickness of the Ge buffer layer is much greater (about 600 nm) than in the examples of FIGS. 5 and 6.

Figure 8:
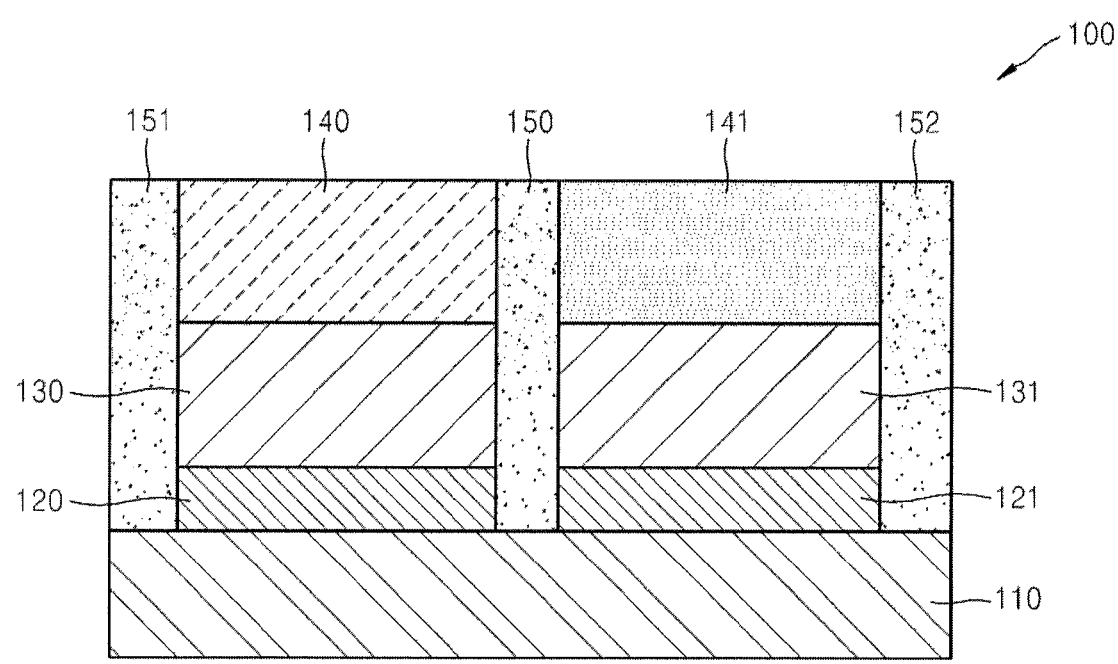
FIG. 8 is a schematic view illustrating a complementary metal oxide semiconductor (CMOS) device according to an exemplary embodiment of the inventive concept.

FIG. 8 is a view illustrating a CMOS device 100 according to an embodiment of the inventive concept.

The CMOS device 100 may include a substrate 110, a first seed layer 120 and a second seed layer 121 disposed on the substrate 110 and spaced apart from each other, a first buffer layer 130 on the first seed layer 120, and a second buffer layer 131 on the second seed layer 121. The substrate 110 may be a Si substrate. Each of the first seed layer 120 and the second seed layer 121 may comprise a single layer or a plurality of layers, as described above. The first seed layer 120 and the second seed layer 121 may include boron (B) and/or phosphorus (P). For example, the first seed layer 120 and the second seed layer 121 may include boron (B), BGe, BSiGe, P, PGe, PSiGe, B:Ge, B:SiGe, P:Ge, or P:SiGe.

The first seed layer 120 and the second seed layer 121 may be formed of the same material or different seed layer materials, as described above. The first buffer layer 130 and the second buffer layer 131 also may be formed of the same material or different buffer layer materials, as described above.

A first layer 140 for a first type transistor may be provided on the first buffer layer 130, and a second layer 141 for a second type transistor may be provided on the second buffer layer 131. The first type transistor may be an n-type, and the second type transistor may be a p-type. Alternatively, the first type may be a p-type, and the second type may be an n-type. An n-type transistor may include an n-type metal oxide semiconductor field effect transistor (MOSFET). A p-type transistor may include a p-type MOSFET. A layer 140 or 141 for an n-type transistor may be formed of a material having high electron mobility, and a layer 140 or 141 for a p-type transistor may be formed of a material having high hole mobility. For example, the first layer 140 and the second layer 141 may be channel layers.

For example, if the first layer 140 or the second layer 141 is a layer for an n-type transistor, the first layer 140 or the second layer 141 may include a group III-V material. For example, for an n-type transistor, the first layer 140 or the second layer 141 may include at least one of InGaAs, InP, InSb, InGaSb, GaSb, and InAs.

If the first layer 140 or the second layer 141 is a layer for a p-type transistor, the first layer 140 or the second layer 141 may include a group IV material. For example, the first layer 140 or the second layer 141 may include germanium (Ge).

The first seed layer 120 and the second seed layer 121 may have thicknesses within the range of greater than 0 nm to about 100 nm. For example, the first seed layer 120 and the second seed layer 121 may have thicknesses within the range of greater than 0 nm to about 50 nm. Owing to the presence of first seed layer 120 and the second seed layer 121, the respective thicknesses of the first buffer layer 130 and the second buffer layer 131 may be reduced while retaining high performance characteristics. If the thicknesses of the first seed layer 120 an/or the second seed layer 121 are greater than about 100 nm, however, defect density or surface roughness may increase and thereby make it difficult to reduce the thicknesses of the first buffer layer 130 and the second buffer layer 131. For example, in combination with a suitable seed layer 120 or 121, respectively, the first buffer layer 130 and the second buffer layer 131 may have thicknesses within the range of greater than 0 μm to about 3 μm. In another example, the first buffer layer 130 and the second buffer layer 131 may have thicknesses within the range of greater than 0 μm to about 2 μm. A first insulation layer 150 may be provided between the first seed layer 120 and the second seed layer 121, between the first buffer layer 130 and the second buffer layer 131, and between the first layer 140 and the second layer 141. A second insulation layer 151 may be further provided on sides of the first seed layer 120, the first buffer layer 130, and the first layer 140. A third insulation layer 152 may be further provided on sides of the second seed layer 121, the second buffer layer 131, and the second layer 141.

The first, second, and third insulation layers 150, 151, and 152 may include a silicon oxide film, a silicon nitride film, or a silicon oxynitride film.

According to a current embodiment as seen in FIG. 8, a CMOS device in which an n-type transistor and a p-type transistor are disposed on the substrate 110 may be provided. In addition, since the thicknesses of the first buffer layer 130 and the second buffer layer 131 are reduced owing to the first seed layer 120 and the second seed layer 121 respectively, defect density may be reduced as described above.

Figure 9:
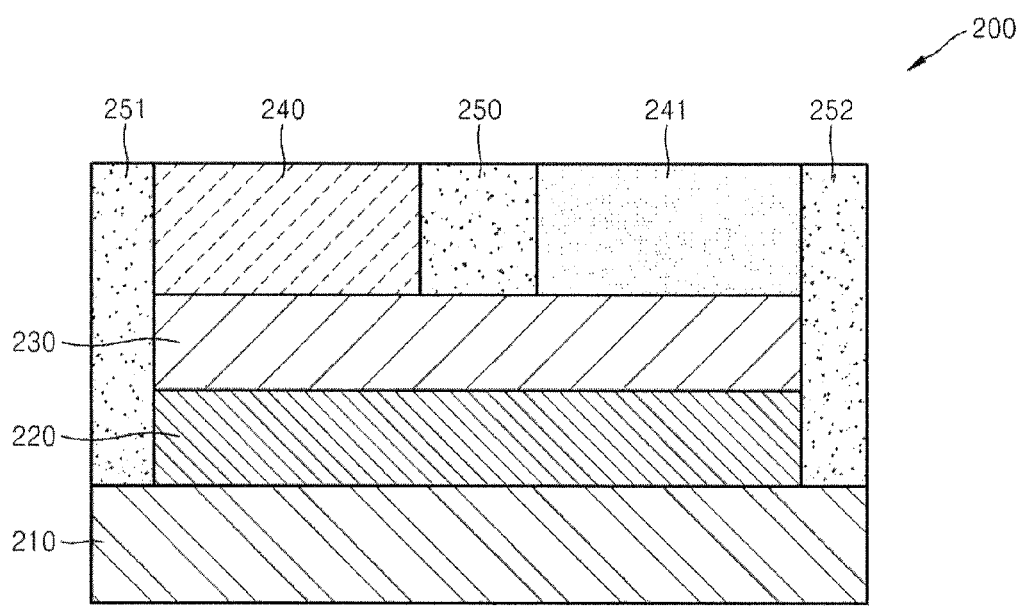
FIG. 9 is a schematic view illustrating a CMOS device according to another exemplary embodiment of the inventive concept.

FIG. 9 is a view illustrating a CMOS device 200 according to another embodiment of the inventive concept. Referring to FIG. 9, the CMOS device 200 may include a substrate 210, a seed layer 220 on the substrate 210, and a buffer layer 230 on the seed layer 220. A first layer 240 and a second layer 241 spaced apart from each other may be provided on the buffer layer 230.

The substrate 210 may be a Si substrate. The seed layer 220 may comprise a single layer or a plurality of layers. The seed layer 220 may include boron (B) and/or phosphorus (P). For example, the seed layer 220 may include boron (B), BGe, BSiGe, P, PGe, PSiGe, B:Ge, B:SiGe, P:Ge, or P:SiGe.

The first layer 240 may be a layer for a first type transistor, and the second layer 241 may be a layer for a second type transistor. The first type transistor may be an n-type, and the second type transistor may be a p-type. Alternatively, the first type may be a p-type, and the second type may be an n-type. An n-type transistor may include an n-type MOSFET. A p-type transistor may include a p-type MOSFET. The first layer 240 and the second layer 241 may be channel layers.

For example, if the first layer 240 or the second layer 241 is a layer for an n-type transistor, the first layer 240 or the second layer 241 may include a group III-V material. For example, for an n-type transistor, the first layer 240 or the second layer 241 may include at least one of InGaAs, InP, InSb, InGaSb, GaSb, and InAs.

If the first layer 240 or the second layer 241 is a layer for a p-type transistor, the first layer 240 or the second layer 241 may include a group IV material. For example, the first layer 240 or the second layer 241 may include germanium (Ge).

For example, the seed layer 220 may have a thickness within the range of greater than 0 nm to about 100 nm. In another example, the seed layer 220 may have a thickness within the range of greater than 0 nm to about 50 nm. The buffer layer 230 may have a thickness within the range of greater than 0 μm to about 3 μm. For example, the buffer layer 230 may have a thickness within the range of greater than 0 μm to about 2 μm. A first insulation layer 250 may be provided between the first layer 240 and the second layer 241. A second insulation layer 251 may be further provided on sides of the seed layer 220, the buffer layer 230, and the first layer 240. A third insulation layer 252 may be further provided on sides of the seed layer 220, the buffer layer 230, and the second layer 241.

The first, second, and third insulation layers 250, 251, and 252 may include a silicon oxide film, a silicon nitride film, or a silicon oxynitride film.

The CMOS device 200 may include an n-type transistor and a p-type transistor that are provided on the silicon substrate 210. Because the thickness of the buffer layer 230 can be reduced owing to the presence of seed layer 220, the cost and time for manufacturing the CMOS device 200 may be reduced.

In FIG. 9, the first insulation layer 250 is provided between the first layer 240 and the second layer 241. Alternatively, the first insulation layer 250 may extend into the buffer layer 230 (not shown).

Next, a method of manufacturing a CMOS device will be described according to an embodiment of the inventive concept.

Figure 10:
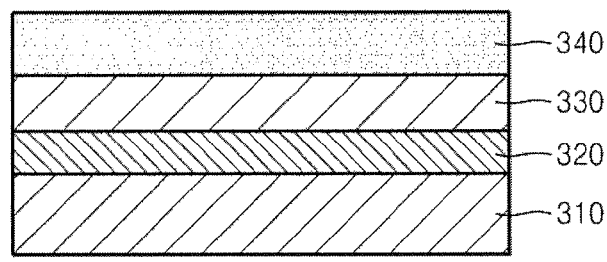
FIGS. 10 to 16 are schematic views illustrating a method of manufacturing a CMOS device according to an exemplary embodiment of the inventive concept.

FIGS. 10 to 16 are views illustrating a method of manufacturing a CMOS device according to an embodiment of the inventive concept. Referring to FIG. 10, a seed layer 320 may be formed on a substrate 310, and a buffer layer 330 may be formed on the seed layer 320. A material layer 340 for a first type transistor (a first type transistor material layer 340) may be formed on the buffer layer 330. For example, the first type transistor may be an n-type transistor or a p-type transistor. The substrate 310 may be a silicon-based substrate. The substrate 310 may be doped with a p-type dopant or an n-type dopant. For example, the substrate 310 may be a silicon substrate. Specifically, the substrate 310 may be a p-type silicon substrate.

For example, the first type transistor material layer 340 may be formed of a group III-V material or a group IV material. The group III-V material and the group IV material will be described hereinafter.

The seed layer 320 may include boron (B) and/or phosphorus (P). For example, the seed layer 320 may include boron (B), BGe, BSiGe, P, PGe, PSiGe, B:Ge, B:SiGe, P:Ge, or P:SiGe.

The buffer layer 330 may be formed of at least one of the group IV materials. For example, the buffer layer 330 may include germanium (Ge). For example, the buffer layer 330 may include at least one of SiGe, GeSn, and germanium (Ge).

The lattice constant difference between the substrate 310 and the buffer layer 330 may be relieved by the seed layer 320, and thus the thickness of the buffer layer 330 may be reduced. The buffer layer 330 relieves the lattice constant difference and thermal expansion coefficient difference between the substrate 310 and the first type transistor material layer 340, and reduces defects as well, thereby improving the crystallinity of the first type transistor material layer 340.

The first type transistor material layer 340 may have a quantum well structure. A wet treatment and an in-situ annealing treatment may be performed as pre-treatments for the first type transistor material layer 340.

Figure 11:
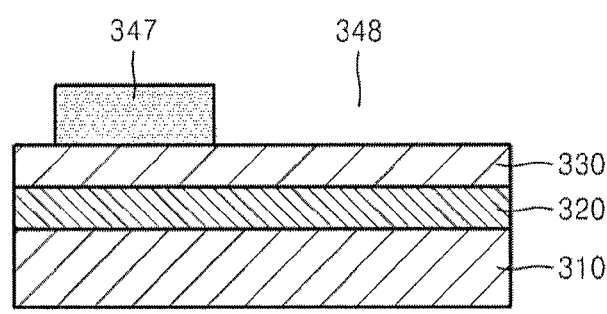

Referring to FIG. 11, the first type transistor material layer 340 may be etched to form a first pattern that includes a pattern region 348 and a first layer 347 for the first type transistor. For example, the first layer 347 may be a channel layer of an n-type transistor or a p-type transistor.

Figure 12:
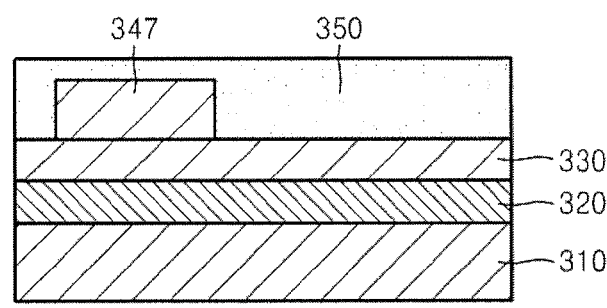
Figure 13:
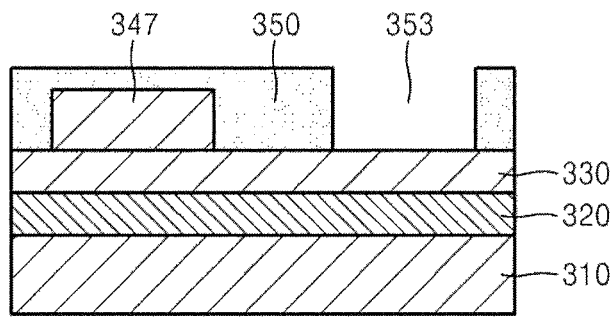
Figure 14:
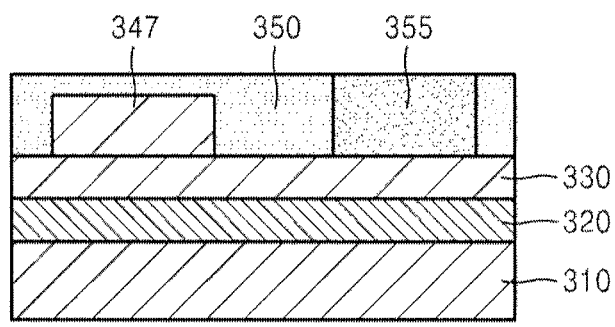

The buffer layer 330 may be partially exposed along the pattern region 348 of the first pattern. The first layer 347 for the first type transistor may be formed through an etching process using photoresist. Next, as shown in FIG. 12, an insulation layer 350 is formed on the first region 348, the exposed buffer layer 330, and the first layer 347 for the first transistor. The insulation layer 350 may be formed of an oxide, a nitride, or an oxynitride. For example, the insulation layer 350 may be formed of a silicon oxide ($SiO_2$), a silicon nitride ($SiN_x$), or a silicon oxynitride ($SiO_xN_y$). Referring to FIG. 13, the insulation layer 350 is etched to form a second pattern that includes a pattern region 353 for selective growth. The buffer layer 330 may be partially exposed along the pattern region 353 of the second pattern. Next, as shown in FIG. 14, a second layer 355 for a second type transistor may be formed through a selective growing process using the pattern region 353 of the second pattern. The second layer 355 may be grown to a height smaller than, equal to, or greater than the depth of the pattern region 353 of the second pattern. After the second layer 355 is grown, the surface of the second layer 355 may be leveled through a planarization process. For example, the planarization process may be performed by a chemical mechanical polishing method. The planarization process is optional. That is, the planarization process may be selectively performed according to the surface state of the second layer 355. The insulation layer 350 may be used as a mask in the selective growing process. For example, the second layer 355 may be for an n-type transistor or a p-type transistor. For example, if the first layer 347 is for a p-type transistor, the second layer 355 may be for an n-type transistor; and, if the first layer 347 is for an n-type transistor, the second layer 355 may be for a p-type transistor. If the second layer 355 is for an n-type transistor, the second layer 355 may be formed of a group III-V material such as a material including at least one of InGaAs, InP, InSb, InGaSb, GaSb, and InAs. If the second layer 355 is for a p-type transistor, the second layer 355 may be formed of a group IV material such as a material including germanium (Ge).

For example, if the second layer 355 is formed of germanium (Ge), the second layer 355 may be grown by an epitaxial method. For example, the second layer 355 may be formed by first growing germanium (Ge) to a thickness of several nanometers (nm) to several tens of nanometers (nm) at a relatively low temperature (for example, about 400° C.) and thereafter growing germanium (Ge) at a temperature higher than the low temperature, for example, at about 600° C. During these steps, the remaining insulation layer 350 may be used as a mask. Since the surface of the first layer 347 is covered with the insulation layer 350, the second layer 355 may be selectively grown on the region of the buffer layer 330 that is exposed by the second pattern.

Figure 15:
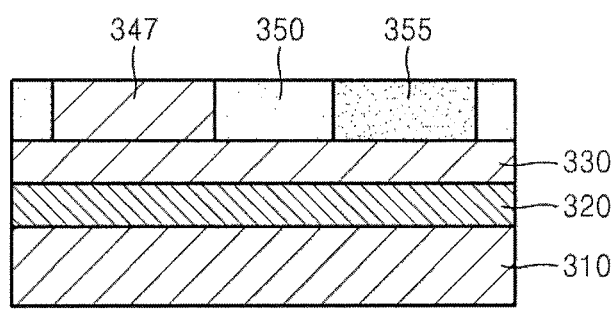

Referring to FIG. 15, the surface of the structure shown in FIG. 14 is leveled by a planarization process to expose the first layer 347. For example, the planarization process may be performed by a chemical mechanical polishing method. In this way, the first layer 347 for the first type transistor and the second layer 355 for the second type transistor may be formed together on the substrate 310. For example, it may be easier and simpler to grow the second layer 355 including germanium (Ge) than to grow the first layer 347 including a group III-V material.

Figure 16:
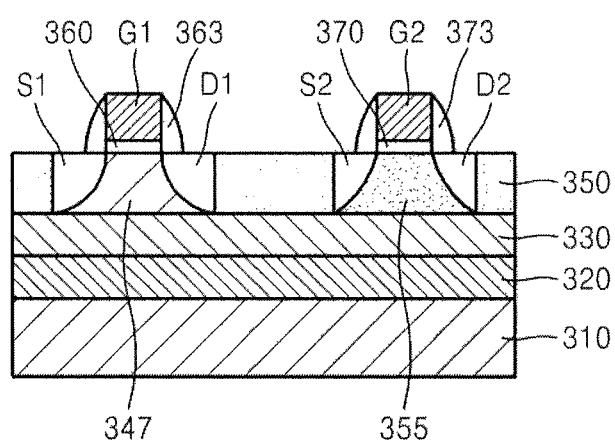

Next, referring to FIG. 16, a first source electrode S1 and a first drain electrode D1 may be formed respectively on both sides of the first layer 347. Alternatively, the first source electrode S1 and the first drain electrode D1 may be formed on an upper side of the first layer 347 at positions spaced apart from each other. A second source electrode S2 and a second drain electrode D2 may be formed respectively on both sides of the second layer 355. Alternatively, the second source electrode S2 and the second drain electrode D2 may be formed on an upper side of the second layer 355 at positions spaced apart from each other. For example, the first and second source electrodes S1 and S2 and the first and second drain electrodes D1 and D2 may be formed by an implantation method. However, the first and second source electrodes S1 and S2 and the first and second drain electrodes D1 and D2 are not limited thereto. That is, the first and second source electrodes S1 and S2 and the first and second drain electrodes D1 and D2 may be formed by other methods. For example, the first and second source electrodes S1 and S2 and the first and second drain electrodes D1 and D2 may be formed of a conductive material such as metal or an alloy. For example, the first and second source electrodes S1 and S2 and the first and second drain electrodes D1 and D2 may be formed of a Ti/Au alloy or a Ge/Au/Ni/Au alloy.

A first gate insulation layer 360 may be formed on the first layer 347, and a second gate insulation layer 370 may be formed on the second layer 355. For example, the first and second gate insulation layers 360 and 370 may include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. However, the first and second gate insulation layers 360 and 370 are not limited thereto. For example, any materials generally used to form gate insulation layers may be used to form the first and second gate insulation layers 360 and 370. First and second gate electrodes G1 and G2 may be formed on the first and second gate insulation layers 360 and 370, respectively. First spacers 363 may be formed on both sides of the first gate electrode G1. Second spacers 373 may be formed on both sides of the second gate electrode G2. The first gate electrode G1, the first source electrode S1, and the first drain electrode D1 may be formed of various metals or conductive oxides. The first gate electrode G1, the first source electrode S1, and the first drain electrode D1 may be formed of the same material or different materials. The second gate electrode G2, the second source electrode S2, and the second drain electrode D2 may be formed of various metals or conductive oxides. The second gate electrode G2, the second source electrode S2, and the second drain electrode D2 may be formed of the same material or different materials. Since the first and second gate insulation layers 360 and 370, respectively, have large energy band gaps, the first and second gate insulation layers 360 and 370 may function as barrier layers for the first layer 347 and the second layer 355.

Figure 17:
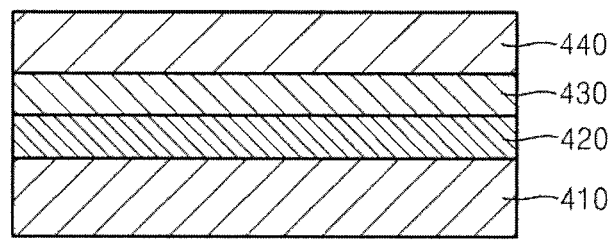
FIGS. 17 to 23 are schematic views illustrating a method of manufacturing a CMOS device according to another exemplary embodiment of the inventive concept.

Next, FIGS. 17 to 23 are views illustrating a method of manufacturing a CMOS device according to another embodiment of the inventive concept. Referring to FIG. 17, a seed layer 420 may be formed on a substrate 410, and a buffer layer 430 may be formed on the seed layer 420. Then, a first type transistor material layer 440 may be formed on the buffer layer 430. The substrate 410 may be a silicon-based substrate. In addition, the substrate 410 may be doped with a p-type dopant or an n-type dopant. For example, the substrate 410 may be a silicon substrate. Specifically, the substrate 410 may be a p-type silicon substrate.

For example, if the first type transistor material layer 440 is an n-type transistor material layer, the first type transistor material layer 440 may be formed of a group III-V material, and if the first type transistor material layer 440 is a p-type transistor material layer, the first type transistor material layer 440 may be formed of a group IV material. The seed layer 420 may include boron (B) and/or phosphorus (P). The seed layer 420, the buffer layer 430, and the first type transistor material layer 440 may be formed of substantially the same materials and have the same functions as the seed layer 320, the buffer layer 330, and the first type transistor material layer 340 described above with reference to FIGS. 10 to 16. Thus, detailed descriptions thereof will not be repeated.

Figure 18:
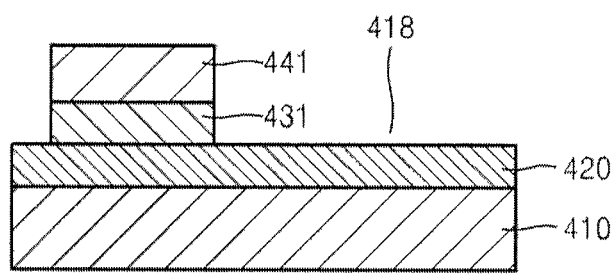
Figure 19:
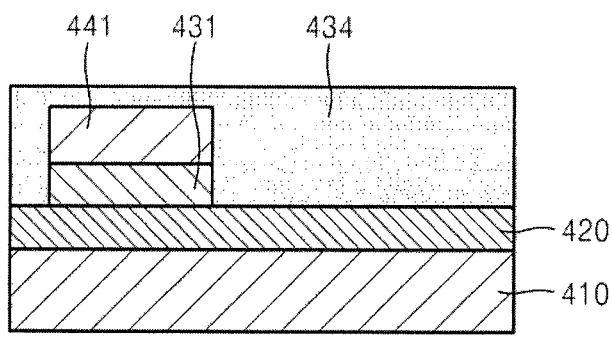

Referring to FIG. 18, the first type transistor material layer 440 may be etched to form a first pattern that includes a pattern region 418, a portion 431 of buffer layer 430, and a first layer 441 for a first type transistor. A portion of the seed layer 420 may be exposed along the pattern region 418 of the first pattern. However, the method is not limited thereto. For example, the buffer layer 430 may be exposed along the pattern region 418 of the first pattern. Next, as shown in FIG. 19, an insulation layer 434 is formed on the exposed seed layer 420 and the first layer 441 for the first transistor. The insulation layer 434 may be formed of an oxide, a nitride, or an oxynitride. For example, the insulation layer 434 may be formed of a silicon oxide ($SiO_2$), a silicon nitride ($SiN_x$), or a silicon oxynitride ($SiO_xN_y$).

Figure 20:
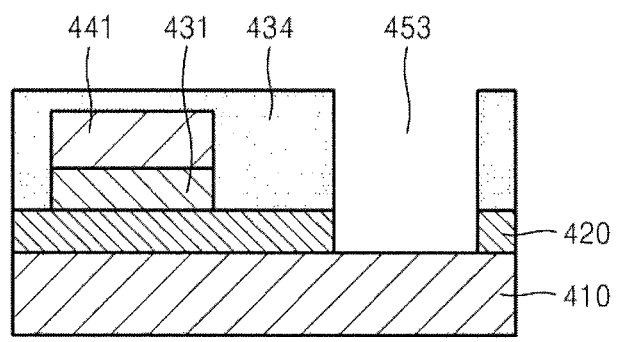
Figure 21:
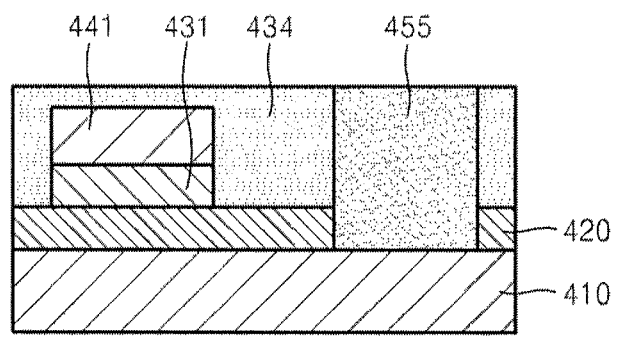

Referring to FIG. 20, the insulation layer 434 is etched to form a second pattern that includes a pattern region 453 for selective growth. The substrate 410 may be exposed along the pattern region 453 of the second pattern. Next, as shown in FIG. 21, a second layer 455 for a second type transistor may be formed through a selective growing process using the pattern region 453 of the second pattern. The insulation layer 434 may be used as a mask in the selective growing process. For example, the second layer 455 may be for an n-type transistor or a p-type transistor. For example, if the first layer 441 is for a p-type transistor, the second layer 455 may be for an n-type transistor; and, if the first layer 441 is for an n-type transistor, the second layer 455 may be for a p-type transistor. If the second layer 455 is for an n-type transistor, the second layer 455 may be formed of a group III-V material such as a material including at least one of InGaAs, InP, InSb, InGaSb, GaSb, and InAs. If the second layer 455 is for a p-type transistor, the second layer 455 may be formed of a group IV material such as a material including germanium (Ge).

Since the surface of the first layer 441 is covered with the insulation layer 434, the second layer 455 may be selectively grown on the region of the substrate 410 that is exposed by the second pattern.

Figure 22:
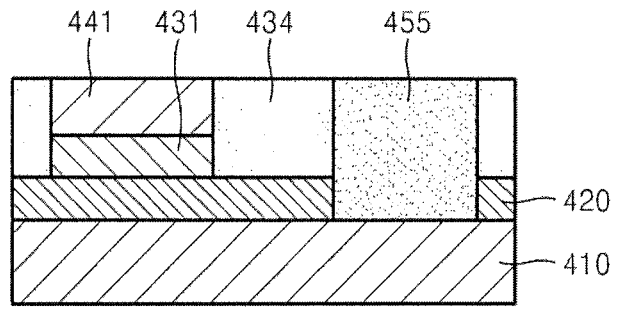
Figure 23:
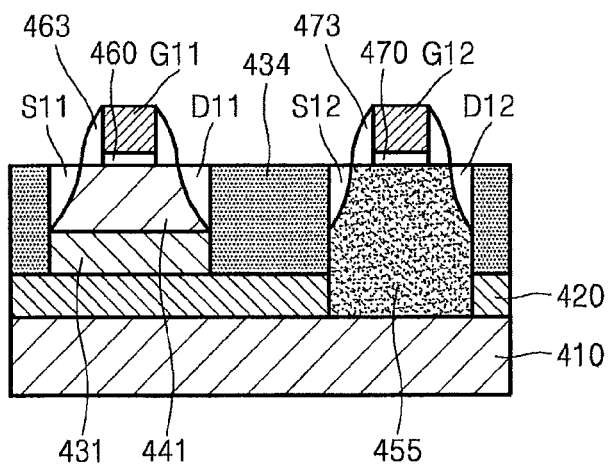

Referring to FIG. 22, the first layer 441 and the second layer 455 may be leveled through a planarization process. Next, referring to FIG. 23, a first source electrode S11 and a first drain electrode D11 may be formed respectively on both sides of the first layer 441. Alternatively, the first source electrode S11 and the first drain electrode D11 may be formed on an upper side of the first layer 441 at positions spaced apart from each other. A second source electrode S12 and a second drain electrode D12 may be formed respectively on both sides of the second layer 455. First spacers 463 may be formed on both sides of a first gate electrode G11. Second spacers 473 may be formed on both sides of a second gate electrode G12. Alternatively, the second source electrode S12 and the second drain electrode D12 may be formed on an upper side of the second layer 455 at positions spaced apart from each other. A first gate insulation layer 460 may be formed on the first layer 441, and the first gate electrode G11 may be formed on the first gate insulation layer 460. A second gate insulation layer 470 may be formed on the second layer 455, and the second gate electrode G12 may be formed on the second gate insulation layer 470.

In a manufacturing method according to another embodiment of the inventive concept, a seed layer may be formed on a substrate, and a buffer layer may be formed on the seed layer. Then, a first layer for a first type transistor may be selectively grown, and a second layer for a second type transistor may be selectively grown thereon.

Figure 24:
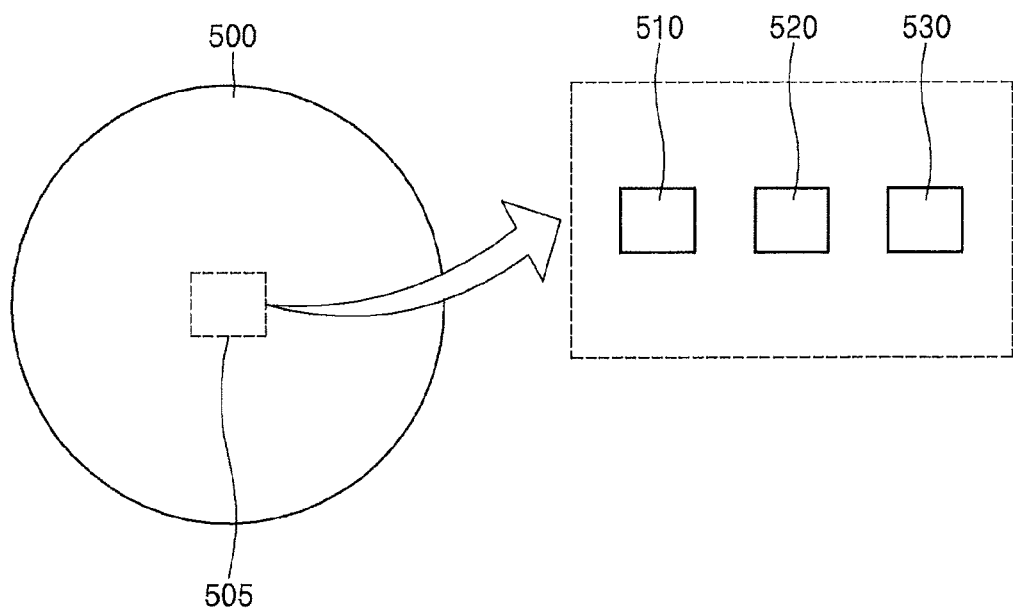
FIG. 24 is a schematic view illustrating an example in which a CMOS device is provided on a wafer according to an exemplary embodiment of the inventive concept.

A plurality of different epic structures coupled to each other may be included in a single cell of a wafer by using the manufacturing methods of the embodiments of the inventive concept. For example, as shown in FIG. 24, a cell 505 of a wafer 500 may include a first region 510, a second region 520, and a third region 530. For example, the first region 510 may be a silicon region, the second region 520 may be a group III-V compound region, and the third region 530 may be a Ge region. For example, an optical device may be disposed in the first region 510, an n-type transistor may be disposed in the second region 520, and a p-type transistor may be disposed in the third region 530. For example, the optical device may be a light emitting diode (LED), a laser diode (LD), or a photo diode (PD). For example, the n-type transistor and the p-type transistor may be operated as electronic devices for supporting light-emitting or light-receiving operations of the optical device. In this way, photonic device integration and hybrid electronic and photonic circuit integration may be realized.

While the substrate structure, the CMOS device, and methods of manufacturing the CMOS device have been particularly shown and described with reference to exemplary embodiments of the inventive concept, it will be understood that various changes in form and details may be made therein without departing from the spirit and scope of the following claims.

What is claimed is:

1. A substrate structure comprising:
 a substrate;
 at least one seed layer provided directly on the substrate wherein the at least one seed layer comprises a graded seed layer having a composition gradient and formed of BGe;
 at least one buffer layer directly on the seed layer wherein the buffer layer comprises at least one layer comprising SiGe or GeSn; and
 a semiconductor layer directly on the at least one buffer layer, wherein the semiconductor is formed of a group III-V material that comprises at least one of InGaAs, InP, InSb, InGaSb, GaSb, and InAs.

2. The substrate structure of claim 1, further wherein the buffer layer comprises a graded buffer layer having a composition gradient, and formed of SiGe.

3. The substrate structure of claim 1, further wherein the buffer layer comprises a Ge buffer-layer component layer directly on the seed layer and an SiGe buffer-layer component layer on the Ge layer.

4. A complementary metal oxide semiconductor (CMOS) device comprising:
 a substrate;
 at least one seed layer provided directly on the substrate and formed of a material comprising boron (B), BGe, or BSiGe, wherein the seed layer comprises first, second, third and fourth seed-layer component layers, and further wherein the seed-layer component layers comprise boron (B) layers and BGe layers alternately arranged, or BGe layers and BSiGe layers alternately arranged;
 at least one buffer layer directly on the seed layer, wherein the buffer layer comprises at least one layer comprising SiGe or GeSn;
 a first layer for a first type transistor, the first layer being disposed directly on the buffer layer, wherein the first layer comprises at least one of InGaAs, InP, InSb, InGaSb, GaSb, and InAs;
 a second layer for a second type transistor, the second layer being spaced apart from the first layer and disposed directly on the buffer layer, wherein the second layer comprises germanium (Ge); and
 a first insulation layer between the first layer and the second layer.

5. The CMOS device of claim 4, wherein the first type transistor comprises an n-type metal oxide semiconductor field effect transistor (MOSFET), and the second type transistor comprises a p-type MOSFET.

6. The CMOS device of claim 4, wherein the first insulation layer is disposed directly on the buffer layer.

7. The CMOS device of claim 4, wherein the first insulation layer passes through the buffer layer and the seed layer.

8. The CMOS device of claim 4, further comprising a second insulation layer, the second insulation layer being spaced apart from the first insulation layer and being provided on sides of the seed layer, the buffer layer, the first layer and the second layer.

9. The complementary metal oxide semiconductor (CMOS) device of claim 4, further wherein the buffer layer comprises a graded buffer layer having a composition gradient, and formed of SiGe.

10. The complementary metal oxide semiconductor (CMOS) device of claim 4, further wherein the buffer layer comprises a Ge buffer-layer component layer directly on the seed layer and an SiGe buffer-layer component layer on the Ge layer.

11. A complementary metal oxide semiconductor (CMOS) device comprising:
 a silicon substrate;
 at least one seed layer provided directly on the substrate wherein the at least one seed layer comprises a graded seed layer having a composition gradient and formed of BGe;
 at least one buffer layer directly on the seed layer, wherein the at least one buffer layer comprises a graded buffer layer having a composition gradient and formed of SiGe;
 a first layer for a first type transistor, the first layer being disposed directly on the buffer layer, wherein the first layer comprises at least one of InGaAs, InP, InSb, InGaSb, GaSb, and InAs;
 a second layer for a second type transistor, the second layer being spaced apart from the first layer and formed directly on and extending from the silicon substrate, wherein the second layer comprises germanium (Ge); and
 an insulation layer between the first layer and the second layer.

12. The CMOS device of claim 11, wherein the insulation layer is disposed on the seed layer between the second layer and the buffer layer.

13. The CMOS device of claim 11, wherein the first type transistor comprises an n-type metal oxide semiconductor field effect transistor (MOSFET), and the second type transistor comprises a p-type MOSFET.

14. The complementary metal oxide semiconductor (CMOS) device of claim 11, further wherein the buffer layer comprises a Ge buffer-layer component layer directly on the seed layer and an SiGe buffer-layer component layer on the Ge layer.

* * * * *